(12) United States Patent
Hansen (10) Patent No.: US 9,363,893 B2
(45) Date of Patent: Jun. 7, 2016

(54) PRINTED CIRCUIT BOARD ARRANGEMENT COMPRISING AN OSCILLATORY SYSTEM

(75) Inventor: Uwe Hansen, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 298 days.

(21) Appl. No.: 14/114,528

(22) PCT Filed: Apr. 20, 2012

(86) PCT No.: PCT/EP2012/057306
§ 371 (c)(1),
(2), (4) Date: Oct. 28, 2013

(87) PCT Pub. No.: WO2012/146547
PCT Pub. Date: Nov. 1, 2012

(65) Prior Publication Data
US 2014/0055974 A1  Feb. 27, 2014

(30) Foreign Application Priority Data

Apr. 28, 2011  (DE) .................. 10 2011 017 692

(51) Int. Cl.
*H05K 1/11*  (2006.01)
*H05K 1/14*  (2006.01)
(Continued)

(52) U.S. Cl.
CPC ............... *H05K 1/148* (2013.01); *G01L 19/06* (2013.01); *G01P 15/0802* (2013.01); *H05K 1/14* (2013.01);
(Continued)

(58) Field of Classification Search
CPC ....... H05K 1/148; H05K 1/144; H05K 1/145; H05K 1/14; H05K 1/141; H05K 1/142; H05K 2201/10075; H05K 1/0271; H05K 5/0056; H05K 2201/2045

USPC ......... 361/748, 749, 750, 760, 761, 762, 784, 361/786, 787, 789, 790, 803, 804; 174/254, 174/255, 260
See application file for complete search history.

(56) References Cited

U.S. PATENT DOCUMENTS

2004/0084208 A1* 5/2004 Ives .................... H05K 1/0271
174/260
2009/0082995 A1  3/2009 Fujiwara et al.
(Continued)

FOREIGN PATENT DOCUMENTS

DE        8031106       3/1981
DE       102007011293   9/2008
(Continued)

OTHER PUBLICATIONS

International Search Report for Application No. PCT/E2012/057306 dated Aug. 2, 2012 (2 pages).

*Primary Examiner* — Hoa C Nguyen
*Assistant Examiner* — Binh Tran
(74) *Attorney, Agent, or Firm* — Michael Best & Friedrich LLP (57) ABSTRACT

The invention relates to a printed circuit board arrangement, more particularly a multilayer printed circuit board. The printed circuit board arrangement comprises at least two printed circuit boards which are arranged parallel to one another and connected to one another. According to the invention, in the case of the printed circuit board arrangement of the type mentioned initially, at least one surface region of one printed circuit board is connected to another printed circuit board of the printed circuit board arrangement by means of an element embodied in an elastic and/or damping fashion in such a way that an oscillatory system, more particularly a spring-mass system, an oscillatory bending strip or a flexurally oscillatory board is formed by means of the surface region of the printed circuit board and the element.

10 Claims, 4 Drawing Sheets

(51) Int. Cl.
*H05K 5/00* (2006.01)
*G01L 19/06* (2006.01)
*H05K 1/18* (2006.01)
*H05K 1/02* (2006.01)
*H05K 3/46* (2006.01)
*H05K 3/00* (2006.01)
*G01P 15/08* (2006.01)
*G01P 15/09* (2006.01)
*G01P 15/125* (2006.01)

(52) U.S. Cl.
CPC ............... *H05K 1/141* (2013.01); *H05K 1/142* (2013.01); *H05K 1/144* (2013.01); *H05K 5/0056* (2013.01); *G01P 15/09* (2013.01); *G01P 15/125* (2013.01); *G01P 2015/0882* (2013.01); *H05K 1/0271* (2013.01); *H05K 1/145* (2013.01); *H05K 3/0064* (2013.01); *H05K 3/4611* (2013.01); *H05K 2201/0133* (2013.01); *H05K 2201/041* (2013.01); *H05K 2201/09063* (2013.01); *H05K 2201/09081* (2013.01); *H05K 2201/10083* (2013.01); *H05K 2201/10151* (2013.01)

(56) References Cited

U.S. PATENT DOCUMENTS

| | | |
|---|---|---|
| 2011/0075384 A1 | 3/2011 | Yeates |
| 2013/0044442 A1* | 2/2013 | Jobert ................. H01L 23/5387 361/749 |

FOREIGN PATENT DOCUMENTS

| | | |
|---|---|---|
| EP | 238915 | 9/1987 |
| JP | 5149967 | 6/1993 |

* cited by examiner

PRINTED CIRCUIT BOARD ARRANGEMENT COMPRISING AN OSCILLATORY SYSTEM

BACKGROUND OF THE INVENTION

The invention relates to a printed circuit board arrangement, in particular a multilayer printed circuit board. The printed circuit board arrangement comprises at least two printed circuit boards arranged mutually parallel and connected to one another.

In the case of printed circuit boards known from the prior art, which are equipped with electronic components, for example with sensors, the problem has been identified that the printed circuit boards together with the components arranged thereon may be excited in natural oscillations which can impair a detection result to be received by the sensor. This problem arises, for example, in the case of sensors which are formed as oscillation receivers, for example in the case of microphones, pressure sensors or acceleration sensors. Furthermore, the problem may consist in an oscillation frequency of the printed circuit board lying in a detection frequency range of the sensor, and thus leading to a detection result which is not in causal relationship with the measurement quantity to be detected.

SUMMARY OF THE INVENTION

According to the invention, in the case of a printed circuit board arrangement of the type mentioned in the introduction, at least one surface region of one printed circuit board is connected to another printed circuit board of the printed circuit board arrangement, by means of an element formed elastically and/or so as to be damping, in such a way that an oscillatory system, in particular a spring-mass system, an oscillatory flexion strip or a flexurally oscillatory plate, is formed by means of the surface region of the printed circuit board and the element.

In this way, the surface region and a component connected to the surface region, for example an oscillation receiver which is formed in order to generate, as a function of a received oscillation, a sensor signal representing the oscillation, in particular a pressure sensor, a rotation rate sensor or an acceleration sensor, can oscillate together with the surface region on the elastically formed element.

Preferably, the elastically formed element is additionally formed so as to be damping, and also form internal damping during the oscillation. In this way, a spring-mass system with an oscillation damper can advantageously be formed.

In the case of a multilayer-design printed circuit board arrangement, comprising at least two, preferably a plurality of printed circuit board layers, the elastically formed element, which is more preferably formed so as to be damping, may advantageously be arranged between two printed circuit boards. The printed circuit boards each form a layer of the multilayer-design printed circuit board arrangement.

The printed circuit board is, for example, a multilayer-design HDI printed circuit board (HDI=High-Density Interconnect), or an ECP printed circuit board (ECP=Embedded-Component Packaging). Interconnects of the individual printed circuit boards of the printed circuit board arrangement, in particular a multilayer printed circuit board, may preferably be connected to one another by means of through-contacts, also referred to as vias. By means of the vias, thermal connections may also be formed between printed circuit boards adjacent to one another. Preferably, the surface region is connected to an electronic component. The electronic component is, for example, a microphone, an acceleration sensor, a rotation rate sensor or a pressure sensor.

An acceleration sensor may, for example, comprise a proof mass and a piezo element connected to the mass. In another embodiment, the acceleration sensor is a micromechanical sensor, in particular a MEMS sensor (MEMS=Micro-Electro-Mechanical Sensor), which is formed in order to capacitively detect a deflection of a sensor mass. The sensor mass weighs, for example, a few micrograms and comprises webs which are connected to beams and are separated from one another along a beam longitudinal direction, which can oscillate between two electrodes forming a capacitor. For example, the sensor mass is maintained in particular in oscillation in an electric field. The oscillation of the sensor mass can be detuned in frequency and/or amplitude by an acceleration acting on the sensor mass, so that the frequency and/or amplitude of the acceleration can be detected as a function of the detuning.

In a rotation rate sensor, a mass of an acceleration sensor can be deflected as a function of a centrifugal force of a rate of a rotation, and the acceleration can thus be detected as a function of the deflection, in particular a capacitance change or piezo voltage proportional to the deflection.

The pressure sensor is preferably formed in order to detect a static air pressure, in particular a change in the air pressure, and to generate a sensor signal which represents the air pressure or the change in the air pressure. To this end, a pressure-sensitive membrane of a container may be connected to a piezo element or to a capacitive element, which can detect a deflection of the membrane.

By means of the electronic component, an additional mass can advantageously be formed, which can oscillate together with the surface region on the elastically formed element. Another electronic component may also be envisaged, as a sensor, for example a microprocessor, which is vibration-sensitive.

Preferably, a resonant frequency of the spring-mass system, comprising the surface region of the printed circuit board, the electronic component and the elastically formed element, is less than a frequency which can be detected by the sensor. Good damping of the vibrations can advantageously be achieved in this way. Also advantageously, the sensor can be decoupled from a resonance, in particular the flexural oscillation resonance, of the printed circuit board, which lies in the frequency detection range of the sensor.

In a preferred embodiment, the surface region is decoupled from oscillations, in particular flexural oscillations, of a surface of the printed circuit board next to the surface region, the printed circuit board comprising a recess for the surface region and the surface region being arranged in the recess. For example, the surface region is decoupled and thus separated from the surface region surrounding the surface region by means of slits, in particular sawed slits. The decoupling may, for example, be generated by means of a saw or by means of laser cutting. By means of the decoupling formed in this way, the surface region can oscillate freely on the elastic element relative to the surface region surrounding the surface region of the printed circuit board.

Preferably, the surface region is connected to the surface of the printed circuit board, in particular the printed circuit board surface surrounding it, by means of a film, in particular a cover film. Preferably, the film has a smaller thickness dimension than the printed circuit board. The intermediate space, in particular a gap, between the printed circuit board and the oscillatory surface region of the printed circuit board, can thus advantageously be sealed. By virtue of the sealing, advantageously no contamination can enter the intermediate space between the printed circuit boards. The film is, for example, coated with adhesive on at least one side. Such a film, in particular self-adhesive film, may also advantageously close the gap, formed for the decoupling, between the surface region and the printed circuit board surface surrounding it, after the printed circuit board has been fitted with components and also after the electronic components have been soldered to the printed circuit board.

In a preferred embodiment, the elastically formed element comprises silicone. By virtue of a silicone element, the element can advantageously have a damping property in addition to the elastic property. More advantageously, the silicone element is substantially resistant to various chemicals.

In another embodiment, the elastically formed element comprises a plastic foam, in particular a polyurethane foam. By virtue of the plastic foam, the elastic element can advantageously be provided economically.

Preferably, the element formed elastically and/or so as to be damping is inserted into a recess of the printed circuit board by means of injection onto the other printed circuit board. For example, the elastically formed element may be incorporated into an interlayer by means of an embedding method. Thus, the other printed circuit board, which is arranged next to and parallel to the printed circuit board, can form an oscillation counter-bearing and fastening point for the elastic element and the surface region, which is connected to the elastic element.

In a preferred embodiment, the element is arranged between the planes formed by the printed circuit board and the other printed circuit board. In this way, the surface region with the printed circuit board surrounding it can advantageously be arranged in the same plane. By virtue of the decoupling by means of the elastic element, in a multilayer printed circuit board assembly no more installation space in the height direction is used up by constructing a spring-mass system.

The invention also relates to a circuit arrangement having a printed circuit board according to the type described above. In the circuit arrangement, at least some of the components of the circuit arrangement are connected mechanically and/or electrically to a surface region of the printed circuit board, which forms an oscillatory system, in particular a spring-mass system, an oscillatory flexion strip or a flexurally oscillatory plate.

The surface region preferably has a surface size on which the sensor can be fastened. For example, a square surface region of a spring-mass system has an edge length of between one centimeter and five centimeters. An oscillatory system in the micro-range may also be envisioned, so that in the case of thin printed circuit boards, for example having a printed circuit board thickness of between 100 and 150 micrometers of the multilayer printed circuit board arrangement, a MEMS sensor with a square dimension having an edge length of 50 micrometers without electronic interconnection of the MEMS sensor may be less than one millimeter, preferably less than 500 micrometers, depending on the resonant frequency to be achieved.

DETAILED DESCRIPTION

Figure 1:
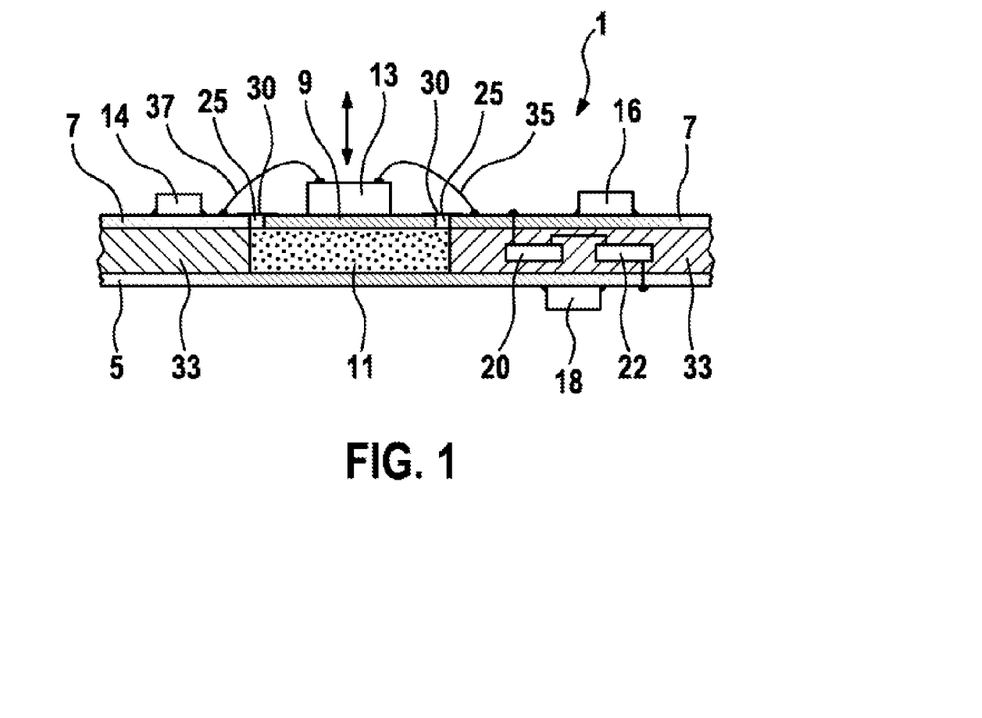
FIG. 1 shows an exemplary embodiment of a printed circuit board arrangement having an oscillatory system formed by a surface region of a printed circuit board and a spring element.

FIG. 1 shows an exemplary embodiment of a printed circuit board arrangement 1. The printed circuit board arrangement 1 comprises a printed circuit board 5 and a printed circuit board 7 connected to the printed circuit board 5. The printed circuit boards 5 and 7 are arranged mutually parallel, an interlayer 33 which connects the printed circuit boards 5 and 7 to one another being arranged at least locally between the printed circuit boards 5 and 7. The printed circuit boards 5 and 7 are for example fiber-reinforced, in particular glass fiber-reinforced epoxy resin printed circuit boards. In this exemplary embodiment, the printed circuit board arrangement 1 forms a multilayer printed circuit board, the printed circuit boards 5 and 7 respectively forming a layer which enclose the interlayer 33, also referred to as an inner layer, between them. For example, the interlayer 33 is formed by an epoxy resin layer. The printed circuit boards 5 and 7 each have a copper sheet on at least one side. The copper sheet may, for example, be formed by an RCC sheet (RCC=Resin-Coated Copper). In this exemplary embodiment, the printed circuit board arrangement 1 also comprises a plurality of electronic components. Electronic components 14 and 16 are represented, which are respectively arranged on one side of the printed circuit board 7. In this exemplary embodiment, the components 14 and 16 are formed by an integrated circuit. The printed circuit board arrangement 1 also comprises electronic components 20 and 22, which are respectively formed as capacitors. The components 20 and 22 are respectively arranged in the interlayer 33, and therefore between the printed circuit boards 5 and 7. An electronic component 18 is also represented, in this exemplary embodiment an integrated circuit, which is arranged on one side of the printed circuit board 5 and is connected to the printed circuit board 5, in particular to copper tracks of the printed circuit board 5.

The printed circuit board 7 comprises a surface region 9 which—for example by means of sawing—has been separated from the printed circuit board 7. The surface region 9 therefore forms a kind of cover, which is enclosed by a gap 25 extending around the cover. The gap 25 is produced, for example, by sawing or laser cutting of the printed circuit board 7. Advantageously, the gap may have been produced before connection of the printed circuit board 7 to the printed circuit board 5. In the case of thin printed circuit boards, a plurality of printed circuit boards may be placed on one another and laser-cut or sawed together. In this way, the thin printed circuit boards cannot break, and more advantageously a plurality of printed circuit boards can be produced economically in one method step.

The surface region 9 of the printed circuit board 7 is connected to the printed circuit board 5 by means of a spring element 11. In this exemplary embodiment, the spring element 11 is formed by a silicone rubber. In this exemplary embodiment, the spring element 11 also has damping properties.

A sensor 13 is also arranged on the surface region 9 of the printed circuit board 7. The sensor 13 is for example a pressure sensor, in particular a microphone, an acceleration sensor or a rotation rate sensor. The sensor 13 is connected to the printed circuit board 7, and there to at least one copper interconnect, by means of bonding wires 35 and 37. In another embodiment, the sensor is electrically connected by means of flip-chip technology or by means of through-contacts, also referred to as vias.

Together with the surface region 9 of the printed circuit board 7, the sensor 13 forms a mass of an oscillatory system, in particular of a spring-mass system. In this exemplary embodiment, the spring element 11 is arranged between the printed circuit boards 5 and 7. In the region of the spring element 11, the interlayer 33 comprises a recess, so that a cavity is formed in which the spring element 11 is arranged. The spring element 11 is therefore arranged in a cavity extending between the printed circuit boards 7 and 5, in particular the surface region 9 and the printed circuit board 5.

By means of the oscillatory system formed in this way, the sensor 13 can advantageously be decoupled from mechanical oscillations of the printed circuit board 5 and of the components connected to the printed circuit board 5.

In this embodiment, the circumferential gap 25 is covered by an adhesive film 30. The adhesive film 30 is, for example, a polyimide film which covers the gap 25 and advantageously has additional damping properties. When the sensor 13 together with the surface region 9 oscillates on the spring element 11, the film 30 can move elastically together with the oscillation movements and generate damping in addition to the damping properties of the spring element 11 by means of the elastic deformations of the to-and-fro movements of the oscillation movement.

A resonant frequency f=ω/2Π of the spring-mass system formed in this way is calculated according to the formula:

$$\omega = \sqrt{\frac{s}{m}}$$

with ω=angular frequency
s=spring stiffness of the spring element
m=mass of the sensor and the surface element.

Figure 2:
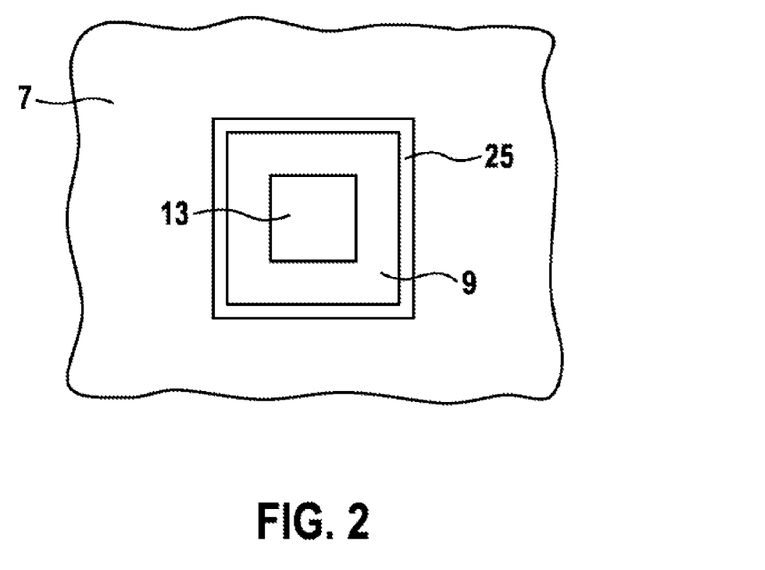
FIG. 2 shows a plan view of the printed circuit board arrangement represented in a sectional view in FIG. 1.

FIG. 2 shows a plan view of the printed circuit board arrangement represented in a sectional view in FIG. 1. The printed circuit board 7, which comprises an opening, is represented.

The surface element 9, which has smaller dimensions than the opening, is arranged in the opening, so that a circumferential gap 25 which encloses the surface region 9 is formed between the surface region 9 and the printed circuit board 7 in the opening. The sensor 13 is arranged on the surface region 9 of the printed circuit board 7 and is connected thereto.

Figure 3:
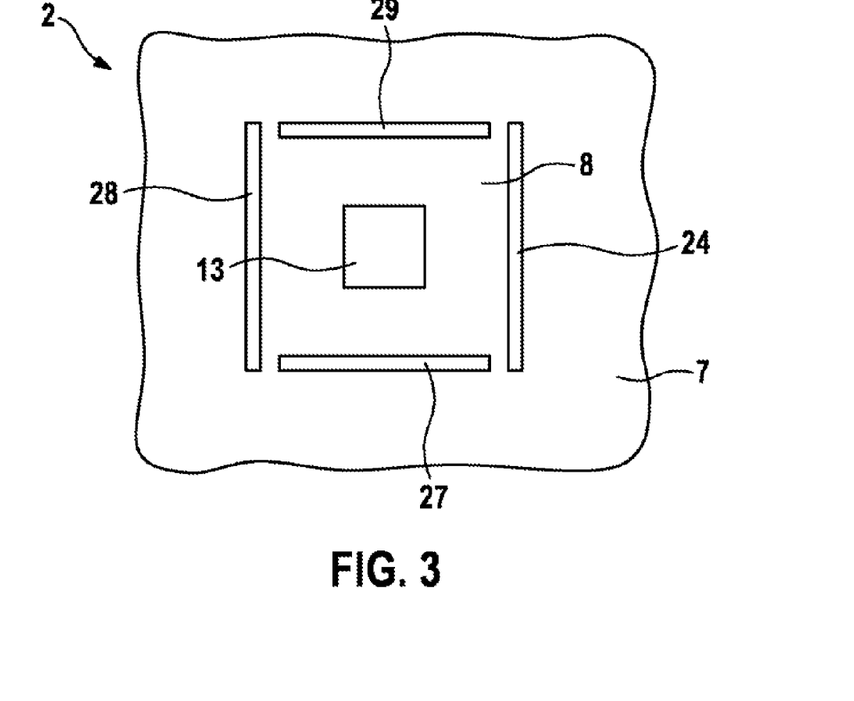
FIG. 3 shows an exemplary embodiment of a printed circuit board arrangement having an oscillatory system formed by a surface region of a printed circuit board and a damping element in plan view.

FIG. 3 shows an exemplary embodiment of a printed circuit board arrangement 2. In this embodiment, the printed circuit board arrangement 2 comprises two printed circuit boards 5 and 7. The printed circuit board 7 comprises an opening, extending lengthwise in a printed circuit board plane of the printed circuit board 7, which forms a gap 29. Transversely with respect to the gap 29, a further gap 28 extends in the region of one end of the gap 29. In the region of the other end of the gap 29, a gap 24 extends in the same direction as the gap 28. The ends of the gaps 24 and 28 which lie next to the gap 29 are respectively separated from the gap 29 by webs, the webs being formed in the printed circuit board 7. The webs are, for example, formed by printed circuit board material of the printed circuit board 7 remaining during the sawing of the gaps 28, 29 and 24. The webs are therefore formed integrally onto the printed circuit board 7. A gap 27 extends parallel to the gap 29 and in the region of the ends of the gaps 24 and 28 away from the gap 29. A surface region 8 of the printed circuit board 7 which is connected to the printed circuit board 7 by means of the webs is therefore enclosed by means of the gaps 24, 28 and 27. The surface region 8 can therefore—suspended from the webs—oscillate to-and-fro transversely in the printed circuit board 7 with respect to a printed circuit board plane of the printed circuit board 7. The to-and-fro oscillation of the surface region 8 causes deformation of the surface region 8, which, for example in the case of a first oscillation mode, describes a kind of cushion shape toward the end regions of an oscillation amplitude.

A sensor 13 is arranged on the surface region 8. The sensor 13 is for example a pressure sensor, an acceleration sensor or a microphone.

Figure 4:
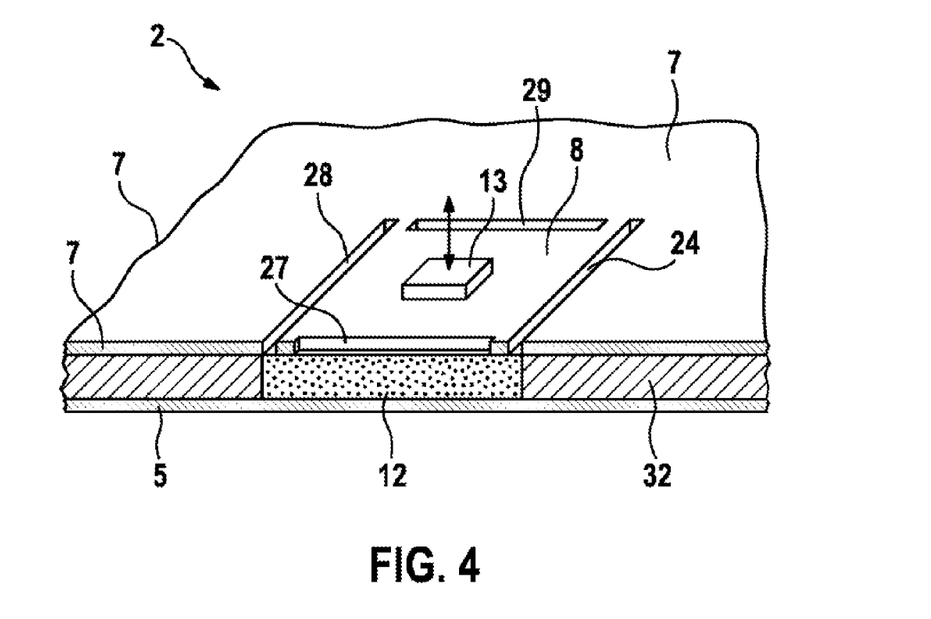
FIG. 4 shows the printed circuit board arrangement of FIG. 3 in a sectional representation.

FIG. 4 shows the printed circuit board arrangement 2 represented in a plan view in FIG. 3 in a sectional representation. The section extends through the gap 27. In this way, the multilayer structure of the multilayer printed circuit board arrangement, comprising three layers in this exemplary embodiment, namely the printed circuit board 5 and the printed circuit board 7 and an interlayer 32 arranged between them. In this exemplary embodiment, the interlayer 32 comprises a cavity, in which a damping element 12 is arranged. The damping element 12 is formed for example by a plastic foam, in particular polyurethane foam, by a silicone rubber or by a gel element, in particular a silicone gel element.

The sensor can oscillate to-and-fro together with the surface region 8 transversely with respect to a printed circuit board plane of the printed circuit board 7, the surface region 8 being suspended from the webs and connected to printed circuit board 7 by means of the webs.

The oscillation of the surface region 8, in particular a resonant frequency, is therefore determined substantially by a flexural stiffness of the printed circuit board material of the printed circuit board 7 and its size. The printed circuit board material is for example fiber-reinforced, in particular glass fiber-reinforced, epoxy resin. In this exemplary embodiment, the oscillation amplitude of the oscillation of the surface region 8 is determined both by the damping properties of the printed circuit board 7, in particular of the surface region 8 of the printed circuit board 7, itself, and by the damping properties of the damping element 12 which connects the surface region 8 to the printed circuit board 5 and is arranged in the intermediate space between the surface region 8 and the printed circuit board 5. The resonant frequency of the oscillatory system may, for example, with a predetermined flexural stiffness of the surface element 8, be established by a length of the gaps 24, 27, 28 and 29. The resonant frequency may, for example, be determined empirically.

Figure 7:
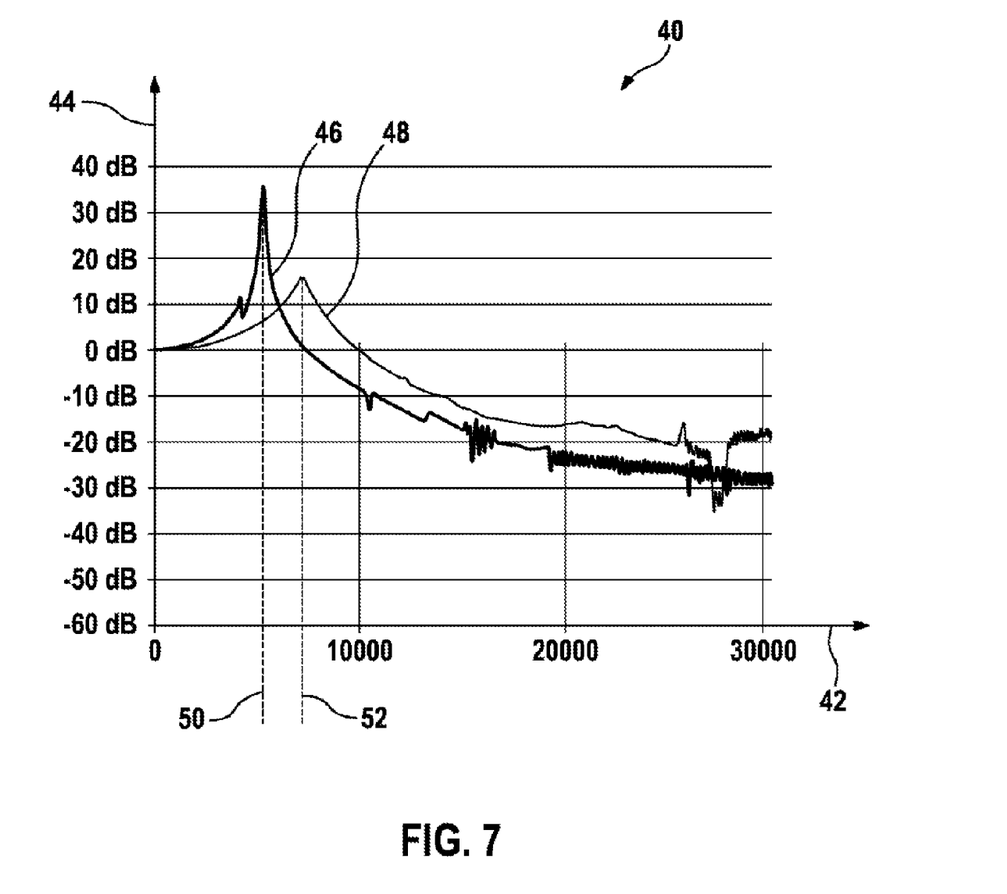
FIG. 7 shows a diagram of two transfer functions of the printed circuit board arrangement in FIGS. 3 and 4.

A frequency profile of the oscillation of the surface region 8 is represented in FIG. 7.

Figure 5:
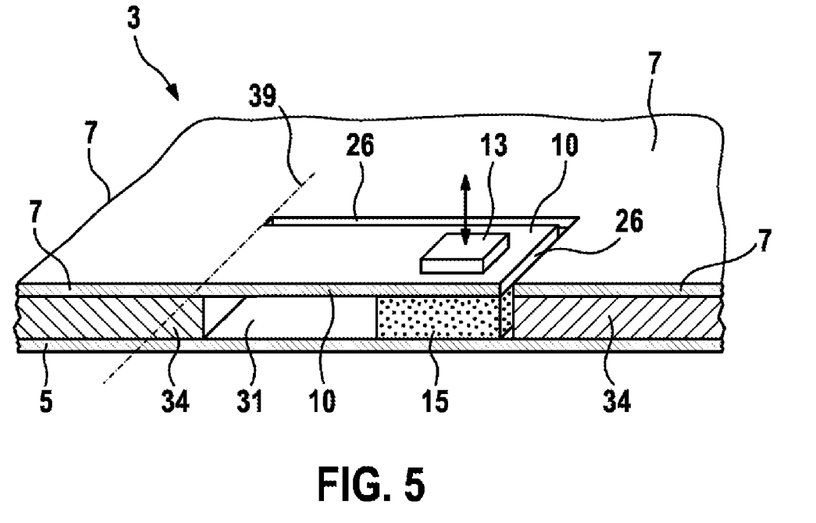
FIG. 5 shows an exemplary embodiment of a printed circuit board arrangement having an oscillatory system formed by a surface region of a printed circuit board and a damping element, the surface region forming a leaf spring having a freely oscillating end.

FIG. 5 shows an exemplary embodiment of a printed circuit board arrangement 3. In this exemplary embodiment, the printed circuit board arrangement 3 comprises three layers, of which one layer are respectively formed by a fiber-reinforced printed circuit board, namely in this exemplary embodiment a printed circuit board 5 and a printed circuit board 7. The printed circuit boards 5 and 7 are connected to one another by an interlayer 34. The interlayer 34 is formed, for example, by an epoxy resin layer. The interlayer 34 comprises a cavity 31, in which a damping element 15 is arranged. In this exemplary embodiment, the damping element 15 fills the cavity 31 only partially. In this exemplary embodiment, the printed circuit board 7 has a U-shaped opening, which forms by the U-shaped gap 26.

The U-shaped gap 26 encloses a surface region 10 of the printed circuit board 7, and the cavity 31 extends between the surface region 10 of the printed circuit board 7 and the printed circuit board 5. In this exemplary embodiment, the surface region 10 has an elongate shape. The surface region 10 can therefore oscillate, starting from a line 39 which joins the ends of the U branches of the gap 26, into the cavity 31 and out of the printed circuit board surface 7.

The surface region 10 may in this case—in a similar way to a springboard—flex in the manner of a spring along its lengthwise extent. The spring properties, in particular a resonant frequency of the oscillatory system formed in this way, are essentially determined by the flexural stiffness of the surface element 10 along its lengthwise extent, and, with a fixed width of the surface element 10, by the freely oscillating length of the surface element 10.

A damping element 15 is arranged in the region of one end of the surface element 10. The damping element 15 connects an end region of the surface element 10 to the printed circuit board 5. The damping element 15 is arranged in the cavity 31 between the printed circuit board 5 and the surface region 10. By means of the damping element 15, the oscillation movement of the surface region 3 transversely to the printed circuit board plane of the printed circuit board 7 can be damped. The damping element 15 is formed for example by a silicone rubber or a gel element, in particular a silicone gel element.

Figure 6:
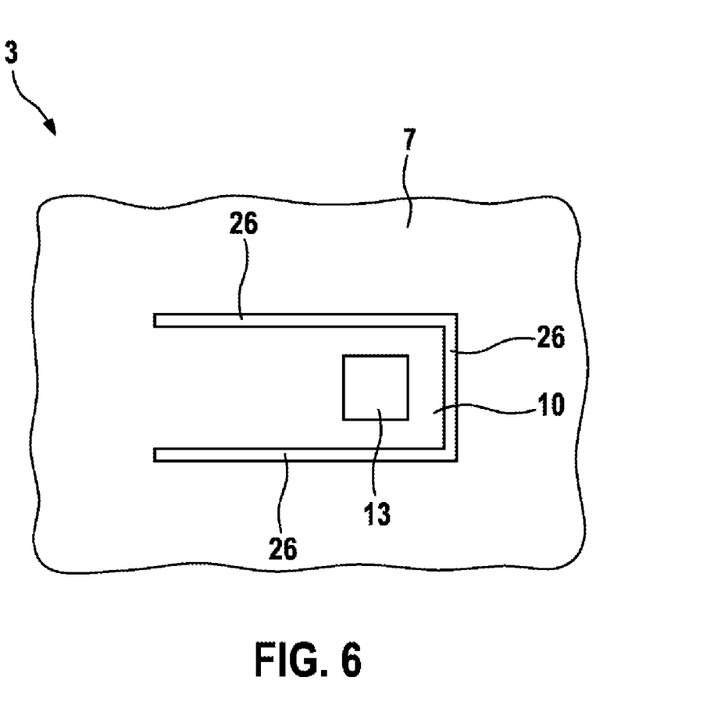
FIG. 6 shows the printed circuit board arrangement of FIG. 5 in a sectional representation.

FIG. 6 shows a plan view of the printed circuit board arrangement 3 already represented in FIG. 5. The sensor 13 is represented, which is connected in the region of one end of the lengthwise-extending surface region 10, which forms a printed circuit board section of the printed circuit board 7, to the surface region 10. The gap 26 enclosing the surface region 10 is also represented. The gap 26 may, for example, have been produced by means of sawing or laser cutting.

FIG. 7 shows a transfer function of an oscillation of the surface region 8, represented in FIG. 4, of the printed circuit board 7. The sensor 13 is connected to the surface region 8. Together with the surface region 8, the sensor 13 therefore forms an oscillatory system. FIG. 7 shows a diagram 40. The diagram 40 has a frequency axis 42 and an amplitude axis 44. On the amplitude axis 44, the transfer value of the oscillation is plotted in decibels. The diagram 40 shows a transfer function 46 of an undamped oscillation of the surface region 8. In the case of the undamped oscillation of the surface region 8, the printed circuit board arrangement 2 does not have a damping element 12. A pronounced resonant frequency 50 of the surface element 8 can be seen. The transfer function 46 falls off strongly toward higher frequencies. There is therefore damping of the oscillatory system toward higher frequencies. The oscillatory system can therefore advantageously be decoupled toward higher frequencies.

A transfer function 48 is also represented. The transfer function 48 represents an oscillation of the surface region 8 which is connected to the printed circuit board 5 by means of the damping element 12. A resonant frequency 52 is also represented, which is greater than the resonant frequency 50. A smaller oscillation amplitude in the region of the resonance 52 than in the region of the resonance 50 of the transfer function 48 can be seen. The smaller amplitude is advantageously caused by the damping of the damping element 12. Starting from the resonant frequency 52, the transfer function falls off steeply toward higher frequencies, so that oscillation decoupling can thereby effectively be produced. In this exemplary embodiment, the resonant frequency 50 is at about 5000 Hertz, and the resonant frequency 52 is at about 7000 Hertz. It can be seen that, starting at frequencies greater than 10,000 Hertz, the sensor 13 is effectively decoupled from oscillations. The sensor 13 can therefore be effectively decoupled by oscillations, in particular flexural oscillations, of the printed circuit boards 5 and 7 of the printed circuit board arrangement. In this way, advantageously, a detection range of the sensor, in particular a frequency range of the detection range of the sensor 13, which lies above the resonant frequency 50 or 52, cannot be impaired, or can be impaired only slightly, by oscillations of the printed circuit board arrangement.

What is claimed is:

1. A printed circuit board arrangement (1, 2, 3) comprising:
at least two printed circuit boards (5, 7) which are arranged parallel to one another and are connected to one another, wherein at least one surface region (8, 9, 10) of one printed circuit board (7) is connected to an electronic component (13) and is connected to another printed circuit board (5) of the printed circuit board arrangement (1, 2, 3) by means of an elastic and/or damping element (11, 12, 15) in such a way that an oscillating system, in particular a spring-mass system, an oscillating bending strip or a flexurally oscillating plate, is formed by means of the surface region (8, 9, 10) of the printed circuit board (7) and the element (11, 12, 15),
wherein the elastic and/or damping element (11, 12, 15) is arranged between the two printed circuit boards (5, 7),
wherein the other printed circuit board (5) which is arranged adjacent and parallel to the printed circuit board forms an oscillating mating bearing and a fastening point for the element (11, 12, 15) and the surface region (8, 9, 10) which is connected to the element (11, 12, 15),
wherein the surface region (8, 9, 10) is connected to the surface of the printed circuit board (7) by means of a covering film or foil (30), so that an intermediate space, specifically a gap (24, 25, 26, 27, 28, 29) which is configured for decoupling, between the printed circuit board (7) and the oscillating surface region (8, 9, 10) of the printed circuit board (7) is sealed, and
wherein the covering film or foil (30) has a smaller thickness dimension than the printed circuit board (7).

2. The printed circuit board arrangement (1,2,3) as claimed in claim 1, wherein the film or foil (30) is an adhesive film or foil which is configured to move elastically together with the oscillation movements and to generate damping in addition to the damping properties of the element (11, 12, 15) by means of the elastic deformations of the to and fro movement of the oscillation movement, wherein the element (11, 12, 15) is resilient and damping.

3. The printed circuit board arrangement (1, 2, 3) as claimed in claim 1, wherein the electronic component (13) is an oscillation receiver which is configured to generate a sensor signal, which represents the oscillation, depending on a received oscillation.

4. The printed circuit board arrangement (1, 2, 3) as claimed in claim 1, wherein the surface region (8, 9, 10) is decoupled from oscillations from a surface of the printed circuit board (7) which is adjacent to the surface region (8, 9, 10), wherein the printed circuit board (7) has a cutout for the surface region (8, 9, 10) and the surface region is arranged in the cutout.

5. The printed circuit board arrangement (1, 2, 3) as claimed in claim 1, wherein the gap is U-shaped.

6. The printed circuit board arrangement (1, 2, 3) as claimed in claim 1, wherein the gap (24, 25, 26, 27, 28, 29) runs around the surface region (8, 9, 10).

7. The printed circuit board arrangement (1, 2, 3) as claimed in claim 1, wherein the element (11, 12, 15) comprises silicone.

8. The printed circuit board arrangement (1, 2, 3) as claimed in claim 1, wherein the element (11, 12, 15) comprises a plastic foam.

9. The printed circuit board arrangement (1, 2, 3) as claimed in claim 1, wherein the element (11, 12, 15) is inserted into a cutout in the printed circuit board (7) by means of injection onto the other printed circuit board (5).

10. The printed circuit board arrangement (1, 2, 3) as claimed in claim 1, wherein at least some of the electric components (13) of the circuit arrangement are mechanically or additionally electrically connected to an oscillating surface region (8, 9, 10) of the printed circuit board arrangement (1, 2, 3).

\* \* \* \* \*